(12) United States Patent
Hatakeyama et al.

(10) Patent No.: US 7,476,486 B2
(45) Date of Patent: Jan. 13, 2009

(54) RESIST COMPOSITION AND PATTERNING PROCESS

(75) Inventors: Jun Hatakeyama, Joetsu (JP); Takanobu Takeda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 352 days.

(21) Appl. No.: 11/354,128

(22) Filed: Feb. 15, 2006

(65) Prior Publication Data

US 2006/0188809 A1 Aug. 24, 2006

(30) Foreign Application Priority Data

Feb. 18, 2005 (JP) ............................. 2005-042472

(51) Int. Cl.
*G03C 1/73* (2006.01)
*G03F 7/038* (2006.01)
*G03F 7/039* (2006.01)

(52) U.S. Cl. .................... 430/270.1; 430/326; 430/325; 430/330; 430/331

(58) Field of Classification Search ........................ None
See application file for complete search history.

(56) References Cited

U.S. PATENT DOCUMENTS

2004/0062971 A1* 4/2004 Nuber ........................ 429/33

FOREIGN PATENT DOCUMENTS

| JP | 6-19136 | 1/1994 |
|---|---|---|
| JP | 10-282649 | 10/1998 |
| JP | 11-109613 | 4/1999 |
| JP | 11-258796 | 9/1999 |

OTHER PUBLICATIONS

Taku Hirayama et al.; "New Photoresist Based on Amorphous Low Molecular Weight Polyphenols", Journal of Photopolymer Science and Technology, vol. 17, No. 3, pp. 435-440, 2004.
Shoko Manako et al.; "High-Purity, Ultrahigh-Resolution Calixarene Electron-Beam Negative Resist". J. Vac. Sci. Technol., B18(6), pp. 3424-3427, Nov./Dec. 2000.
Mike Williamson et al.; "Lithographic Performance of Thin Dendritic Polymer Resist", J. Vac. Sci. Technol. B 18(6), pp. 3345-3348, Nov./Dec. 2000.
Nobuyuki N. Matsuzawa et al.; "Theoretical Calculation of Photoabsorption of Various Polymers in an Extreme Ultraviolet Region", Japan Journal of Appl. Phys, vol. 38, Part I, No. 12B, pp. 7109-7113, Dec. 1999.
Masaya Sawamura et al.; "The First Pentahaptofullerene Metal Complexes", J. Am. Chem. Soc., 118, pp. 12850-12851, 1996.

* cited by examiner

*Primary Examiner*—Sin J. Lee
(74) *Attorney, Agent, or Firm*—Westerman, Hattori, Daniels & Adrian, LLP.

(57) ABSTRACT

A resist composition comprising a fullerene having five phenol derivatives is provided.

5 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2005-042472 filed in Japan on Feb. 18, 2005, the entire contents of which are hereby incorporated by reference.

TECHNICAL FIELD

This invention relates to a resist composition comprising a phenolic hydroxyl group-containing fullerene, and more particularly to a chemically amplified positive or negative resist composition; and a patterning process using the same.

BACKGROUND ART

Progress in the production of integrated circuits employing large scale integration and high operating speeds has been characterized by an ever decreasing pattern rule. It was expected in the "National Technology Roadmap for Semiconductors" (Semiconductor Industry Association, 1994) that the mass scale production of 180-nm rule devices would start from 2001. Actually, the production started in 1999, two years earlier than expected. For the production of 180-nm devices, ArF (193 nm) lithography was believed promising, but KrF (248 nm) lithography has survived. Use of KrF lithography is contemplated for the mass-scale production of 150-nm devices and even 130-nm devices. The mature KrF lithography accelerates microfabrication toward an ever decreasing feature size. It is expected that the ArF and $F_2$ (157 nm) lithography enable micropatterning to a feature size of 90 nm and 65 nm, respectively, while the candidates for further miniaturization include EB projection reduction exposure (PREVAIL, SCALPEL) and EUV using a light source of soft x-ray. In the prior art, the type of polymer for photoresist applications made a drastic change whenever the wavelength of light changed. This change is to insure a transmittance necessary for photoresist film. For example, the transition from g-line to i-line invited a change of the photosensitive material base from benzophenone to non-benzophenone type. The transition from i-line to KrF laser entailed a change from the novolac resin, which had been used for some time, to hydroxystyrene system. The transition from KrF to ArF invited a dramatic change from the double bond-bearing polymers, which are non-transmissive to this light, to cycloaliphatic polymers. To comply with $F_2$ laser, a study is being made on cycloaliphatic polymers having fluorine atoms incorporated therein such as Teflon® for further enhanced transmittance.

For high-energy radiation with very short wavelength such as EB and x-rays, since light elements such as hydrocarbons used in resist materials have little absorption, resist materials based on polyhydroxystyrene have been under investigation.

In practice, resist materials for EB have been used in mask-writing application while the mask production technology is lately regarded problematic. Since the g-line age, reducing projection aligners have been used, with their demagnifying power being ⅕. Recently, a demagnifying power of ¼ is employed along with the enlargement of chip size and the increasing aperture of projection lens. Not only a reduction in line width as a result of progress of micropatterning, but also a reduction in line width as a result of magnifying power change pose serious problems to the mask production technology.

The exposure system for use in mask production has changed from a laser beam exposure system to an electron beam (EB) exposure system in order to increase the line width accuracy. Since definition of a finer feature size becomes possible by increasing the acceleration voltage in an electron gun in the system, the acceleration voltage has increased from 10 keV to 30 keV. An acceleration voltage of 50 keV now becomes the mainstream.

In conjunction with the increasing acceleration voltage, a lowering of resist sensitivity becomes a problem. As the acceleration voltage increases, the influence of forward scattering within the resist film is reduced so that the contrast of electron writing energy is improved, resulting in improvements in resolution and dimensional control. However, since such electrons can penetrate straight through the resist film, the sensitivity of the resist lowers. Since the mask exposure system carries out exposure by direct writing along a continuous stroke, the lowering of resist sensitivity undesirably leads to a lowering of productivity. To meet the demand for higher sensitivity, chemically amplified resist materials are then under consideration.

One problem associated with the high speed EB lithography is low throughputs. While chemically amplified resist materials greatly contributed to the achievement of higher sensitivity, the level of sensitivity achieved is still insufficient. A further increase of sensitivity is constantly required.

However, even when resist materials gain a progress toward higher sensitivity, a continuous stroke of writing with point beam takes a time of several hours in writing on a single wafer because of the increase of writing area and the complexity of writing pattern. For the projection reduction exposure using a mask, only a throughput of several wafers per hour is achieved at maximum because the cell projection as in light exposure is impossible. The low-energy e-beam proximity lithography (LEEPL) is expected to achieve a throughput of several tens of wafers per hour because of possible cell projection and increased resist sensitivity.

By virtue of the increase in accelerating voltage in mask writing and the use of chemically amplified resist material with a high contrast, a size of 500 nm positioned 125 nm above the wafer can now be written with precision through ¼-demagnifying power exposure. However, KrF survived to a device size of 130 nm, and the application of ArF is said to start from 90 nm, and $F_2$ predicted from 65 nm. The limit of $F_2$ photolithography is predicated to be 50 nm. At this point, the size on the mask is 200 nm. At the present, size control of 200 nm is difficult to perform only with an improvement in resolution of resist material. In the case of photolithography, a thinning of resist film greatly contributes to resolution improvement. This is because the introduction of CMP or the like has driven forward device flattening. In the case of mask manufacture, substrates are flat and the thickness of substrates (e.g., Cr, MoSi, $SiO_2$) to be processed is predetermined by a percent light shield and phase shift control. The dry etch resistance of resist film must be improved before the film can be reduced in thickness.

It is generally believed that there is a correlation between the carbon density and the dry etching resistance of resist film. For EB writing which is not affected by absorption, resist materials based on novolac resins having better etching resistance have been developed. The novolac resins, however, are difficult to control their molecular weight and dispersity and thus deemed unsuitable for micropatterning.

Also, with respect to the extreme ultra violet exposure (EUV) at wavelength 5-20 nm which is expected as the exposure means in lithographic micropatterning to 70 nm et seq. as well as $F_2$ exposure, the reduced absorption of carbon atoms was reported. It was found that increasing the carbon density is effective not only for improving dry etching resistance, but also for increasing the transmittance in the soft x-ray wavelength region. See N. Matsuzawa et al., Jpn. J. Appl. Phys., Vol. 38, pp. 7109-7113 (1999).

As the line width is reduced, it becomes necessary to reduce the edge roughness. It is believed that the magnitude of roughness is correlated to the molecular weight of a base polymer. Thus a number of resists based on low molecular weight polymers have been proposed for reducing the roughness. Exemplary polymers include dendritic polymers as described in J. Vac. Sci. Technol., B18(6), November/December 2000, p 3345; calixarenes as described in J. Vac. Sci. Technol., B18(6), November/December 2000, p 3424; and polyphenols as described in J. Photopolymer Sci. and Tech., Vol. 17, No. 3 (2004).

The low molecular weight compound-based resists proposed thus far include resist materials based on fullerenes. JP-A 6-19136 describes a fullerene having methacryloamide groups as the photosensitive group; JP-A 10-282649 describes a resist composition having a fullerene admixed in an ordinary resist material; JP-A 11-258796 describes a fullerene having carboxyl and tetrahydronaphthol groups; and JP-A 11-109613 describes the addition of a fullerene having malonic acid ester substituted thereon for increased solubility to ordinary chemically amplified positive or negative resist compositions.

While fullerenes are advantageous for micropatterning because of their low molecular weight and characterized by better etching resistance because of their very high carbon density, the lack of solvent solubility and alkali solubility is a problem.

DISCLOSURE OF THE INVENTION

An object of the present invention is to provide a resist composition which has good solvent solubility, alkali solubility, sensitivity and resolution, and forms a resist film with improved etching resistance; and a pattern forming process using the same.

Making extensive investigations to obtain positive and negative resist compositions in the latest demand which offer a high sensitivity, high resolution, exposure latitude, a satisfactory etched profile, and improved etching resistance, the inventors have found that this and other objects are attainable using a fullerene having phenol groups or phenol derivative groups as a base resin in positive and negative resist compositions, especially chemically amplified resist compositions.

More particularly, the present invention pertains to a resist composition comprising a fullerene having phenol groups or phenol derivative groups; this class of fullerenes overcomes the drawback of prior art fullerenes, that is, improves solvent solubility and alkali solubility, and has a high resolution, exposure latitude, minimal proximity bias, and process adaptability, all surpassing the prior art resist compositions, forms a well-defined pattern profile after exposure, and exhibits improved etching resistance. Because of these advantages, this class of fullerenes is best suited as a base resin in positive and negative resist compositions, especially chemically amplified positive and negative resist compositions.

In one aspect, the present invention provides a resist composition comprising a fullerene having the general formula (1).

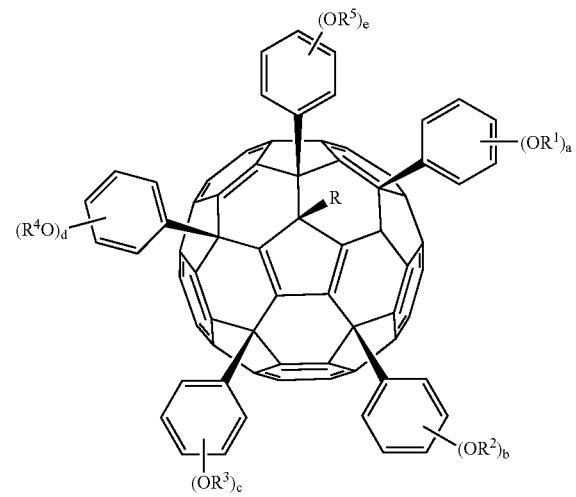

Herein R is hydrogen or an alkyl group of 1 to 4 carbon atoms, $R^1$ to $R^5$ each are hydrogen or an acid labile group, a, b, c, d, and e each are an integer of 0 to 2, and the sum of a+b+c+d+e is 1 to 10.

Typically the resist composition is of the chemically amplified type, further comprising an organic solvent and a photoacid generator. In a preferred embodiment, the resist composition is of the chemically amplified positive type, further comprising a dissolution inhibitor. In another preferred embodiment, the resist composition is of the chemically amplified negative type, further comprising a crosslinking agent. In any of these embodiments, the resist composition may further comprises a basic compound and/or a surfactant.

In another aspect, the present invention provides a process for forming a pattern, comprising the steps of applying the resist composition onto a substrate to form a coating; heat treating the coating and exposing the coating to high energy radiation; optionally heat treating the exposed coating, and developing the coating with a developer.

The positive and negative resist compositions, especially chemically amplified positive and. negative resist compositions of the invention find applications not only in the lithography process of forming semiconductor circuits, but also in the formation of mask circuit patterns and the formation of micro-machines and thin-film magnetic head circuits.

BENEFITS OF THE INVENTION

The resist compositions of the invention have a significantly high contrast of alkali dissolution rate before and after exposure, a high sensitivity and resolution, a well-defined pattern profile after exposure, and a controlled rate of acid diffusion, and exhibits improved etching resistance. Therefore, the positive and negative resist compositions, especially chemically amplified positive and negative resist compositions are best suited for the microfabrication of VLSI devices or micropatterning of photomasks.

DESCRIPTION OF THE PREFERRED EMBODIMENTS

Fullerene

A class of fullerenes used in the resist composition of the invention has the general formula (1). Of these, those fullerene compounds having phenol groups are known as penta-adduct fullerenes, and their synthesis method is proposed by Nakamura et al., J. Am. Chem. Soc., 118, 12850 (1996).

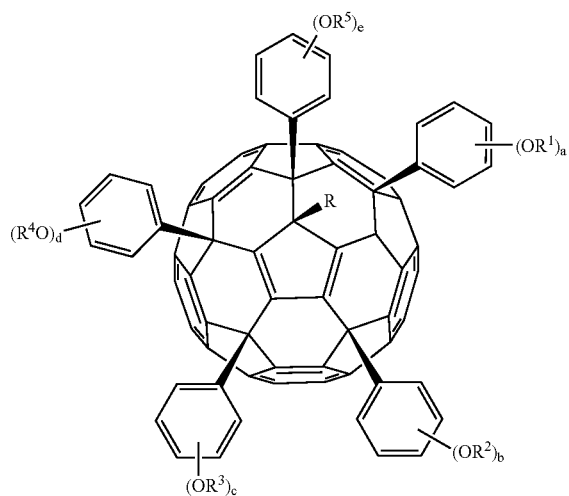

(1)

Herein R is hydrogen or an alkyl group of 1 to 4 carbon atoms, $R^1$ to $R^5$ each are hydrogen or an acid labile group, subscripts a, b, c, d, and e each are an integer of 0 to 2, and the sum of a+b+c+d+e is 1 to 10.

Exemplary of R are hydrogen, methyl, ethyl, n-propyl, isopropyl, n-butyl, isobutyl, sec-butyl and t-butyl. The sum of a+b+c+d+e is preferably 1 to 8, more preferably 2 to 8.

While $C_{60}$ fullerene is used herein as the base from which phenyl, phenol and similar groups are pendant, the base may include $C_{70}$ fullerene, $C_{76}$ fullerene, $C_{78}$ fullerene, and even $C_{80}$ fullerene, $C_{82}$ fullerene, $C_{84}$ fullerene, $C_{90}$ fullerene, $C_{96}$ fullerene and the like, and mixtures thereof.

The acid labile groups represented by $R^1$ to $R^5$ in formula (1) are selected from a variety of such groups, and preferably from among groups of the formulae (A-1), (A-2) and (A-3) below.

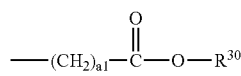

(A-1)

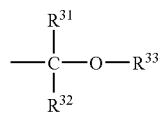

(A-2)

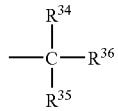

(A-3)

In formula (A-1), $R^{30}$ is a tertiary alkyl group having 4 to 20 carbon atoms, preferably 4 to 15 carbon atoms, a trialkylsilyl group in which each alkyl moiety has 1 to 6 carbon atoms, an oxoalkyl group having 4 to 20 carbon atoms, or a group of formula (A-3). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. The subscript "a1" is an integer of 0 to 6.

In formula (A-2), each of $R^{31}$ and $R^{32}$ is a hydrogen atom or a straight, branched or cyclic alkyl group of 1 to 18 carbon atoms, preferably 1 to 10 carbon atoms, such as methyl, ethyl, propyl, isopropyl, n-butyl, sec-butyl, tert-butyl, cyclopentyl, cyclohexyl, 2-ethylhexyl and n-octyl. $R^{33}$ is selected from monovalent hydrocarbon groups of 1 to 18 carbon atoms, preferably 1 to 10 carbon atoms, which may contain a hetero atom or atoms such as oxygen atom, for example, straight, branched or cyclic alkyl groups, and substituted alkyl groups in which some hydrogen atoms are substituted by hydroxyl, alkoxy, oxo, amino or alkylamino groups. Illustrative examples of substituted alkyl groups are shown below.

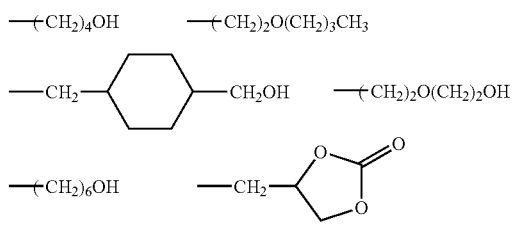

A pair of $R^{31}$ and $R^{32}$, $R^{31}$ and $R^{33}$, or $R^{32}$ and $R^{33}$ may form a ring with the carbon atom to which they are attached. Each of $R^{31}$, $R^{32}$ and $R^{33}$ is a straight or branched alkylene group of 1 to 18 carbon atoms, preferably 1 to 10 carbon atoms, when they form a ring. The number of carbon atoms in the ring is preferably from 3 to 10, more preferably from 4 to 10.

Illustrative, non-limiting, examples of the acid labile group of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups of formulae (A-1)-1 to (A-1)-9 below.

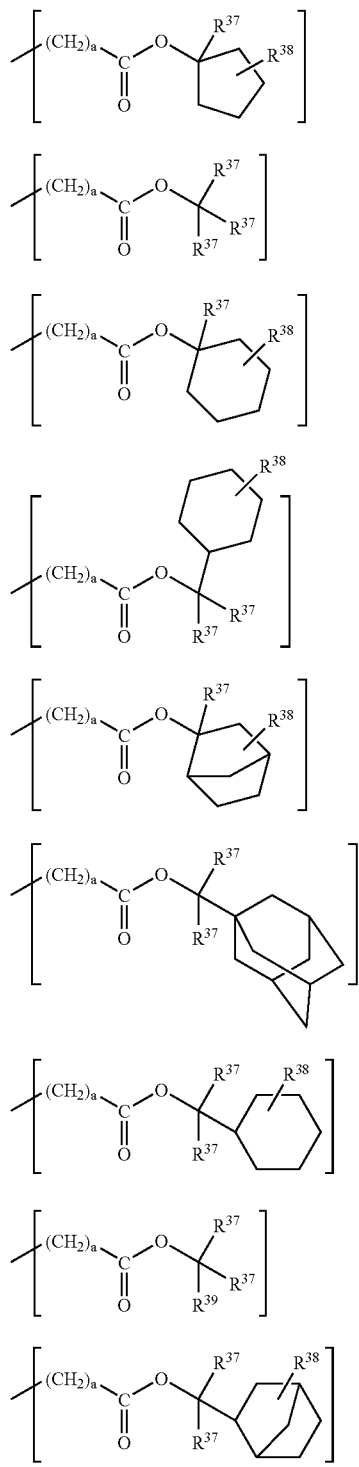

In the above formulae, $R^{37}$ is each independently a straight, branched or cyclic $C_1$-$C_{10}$ alkyl group or a $C_6$-$C_{20}$ aryl group; $R^{38}$ is a hydrogen atom or a straight, branched or cyclic $C_1$-$C_{10}$ alkyl group; and $R^{39}$ is each independently a straight, branched or cyclic $C_2$-$C_{10}$ alkyl group or a $C_6$-$C_{20}$ aryl group.

Of the acid labile groups of formula (A-2), straight or branched groups are exemplified by those of formulae (A-2)-1 to (A-2)-29 below.

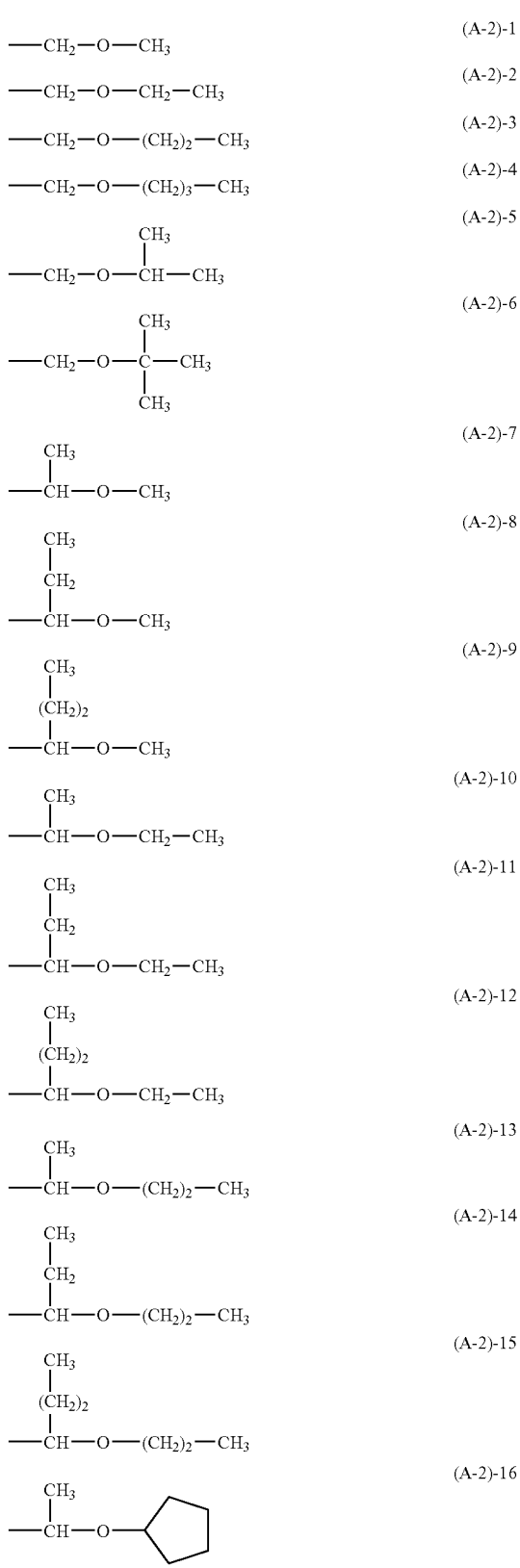

-continued (A-2)-17 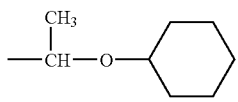

(A-2)-18 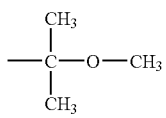

(A-2)-19 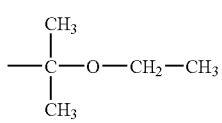

(A-2)-20 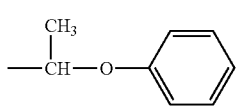

(A-2)-21 

(A-2)-22 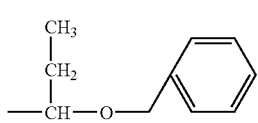

(A-2)-23 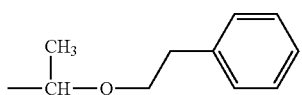

(A-2)-24 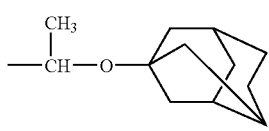

(A-2)-25 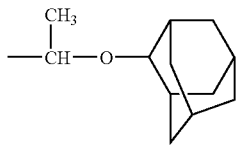

(A-2)-26 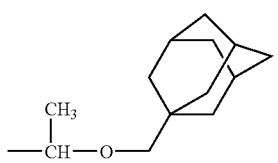

(A-2)-27 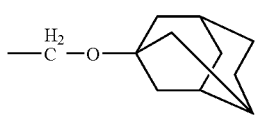

(A-2)-28 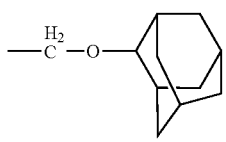

(A-2)-29 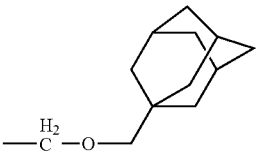

Of the acid labile groups of formula (A-2), examples of cyclic groups include tetrahydrofuran-2-yl, 2-methyltetrahydrofuran-2-yl, tetrahydropyran-2-yl and 2-methyltetrahydropyran-2-yl.

In an alternative embodiment, the fullerene may be crosslinked within the molecule or between molecules with acid labile groups of the general formula (A-2a) or (A-2b).

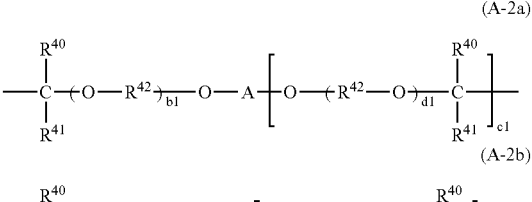

(A-2a)

(A-2b)

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring; $R^{42}$ is a straight, branched or cyclic $C_1$-$C_{10}$ alkylene group; the subscripts b1 and d1 are 0 or integers of 1 to 10, and preferably 0 or integers of 1 to 5; c1 is an integer of 1 to 7; "A" is a (c1+1)-valent aliphatic or alicyclic saturated hydrocarbon group, aromatic hydrocarbon group or heterocyclic group having 1 to 50 carbon atoms, which may be separated by a hetero atom or atoms and in which some of the hydrogen atoms attached to carbon atoms may be substituted by hydroxyl, carboxyl or carbonyl groups or fluorine atoms; and B is —CO—O—, —NHCO—O— or —NHCONH—.

Preferably, "A" is selected from di- to tetra-valent straight, branched or cyclic $C_1$-$C_{20}$ alkylene groups, alkyltriyl. groups, alkyltetrayl groups and $C_6$-$C_{30}$ arylene groups, which may be separated by a hetero atom or atoms and in which some of the hydrogen atoms attached to carbon atoms may be substituted by hydroxyl, carboxyl or acyl groups or halogen atoms. The subscript c1 is preferably an integer of 1 to 3.

The crosslinking acetal groups of formulae (A-2a) and (A-2b) are exemplified by the following formulae (A-2)-30 through (A-2)-37.

(A-2)-30

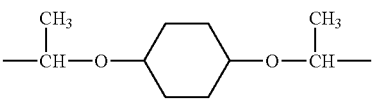

(A-2)-31

-continued

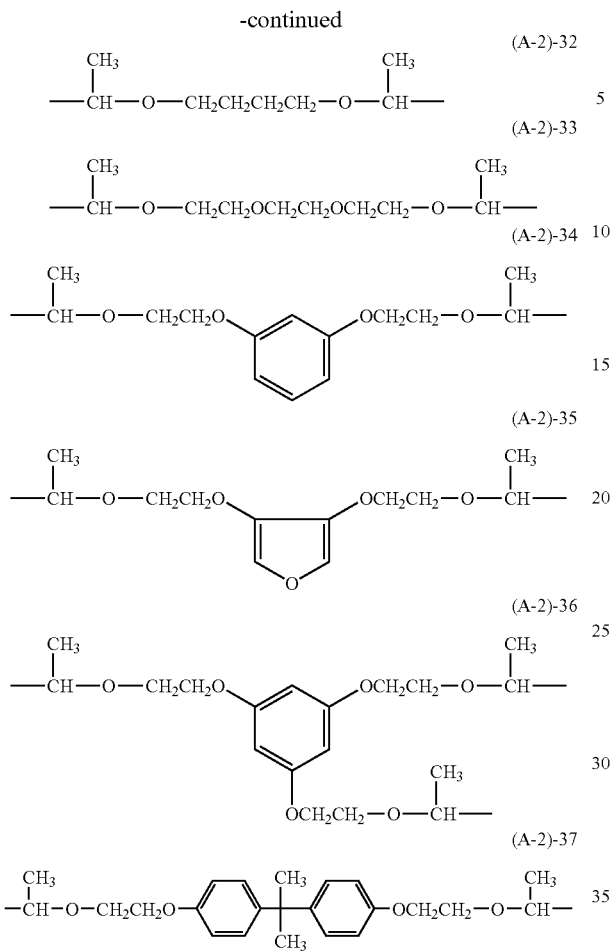

Referring to formula (A-3), each of $R^{34}$, $R^{35}$ and $R^{36}$ is a monovalent hydrocarbon group, typically a straight, branched or cyclic $C_1$-$C_{20}$ alkyl group, which may contain a hetero atom or atoms such as oxygen, sulfur, nitrogen or fluorine. A pair of $R^{34}$ and $R^{35}$, $R^{34}$ and $R^{36}$, or $R^{35}$ and $R^{36}$ may bond together to form a ring of 3 to 20 carbon atoms with the carbon atom to which they are attached.

Suitable tertiary alkyl groups of formula (A-3) include, but are not limited to, tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Also included in the tertiary alkyl groups are those of formulae (A-3)-1 to (A-3)-18 below.

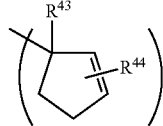

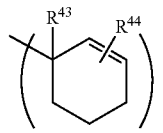

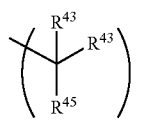

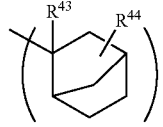

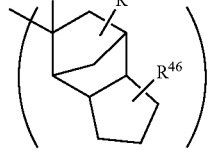

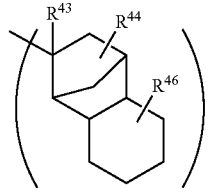

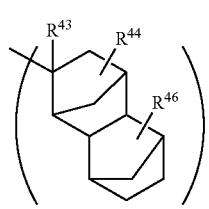

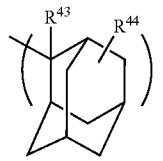

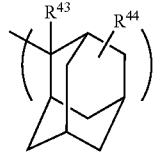

-continued (A-3)-12
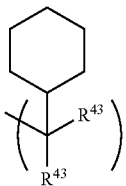

(A-3)-13
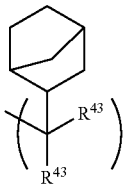

(A-3)-14
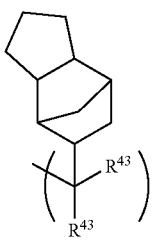

(A-3)-15
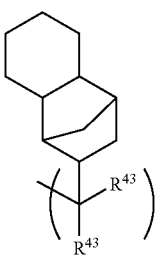

(A-3)-16
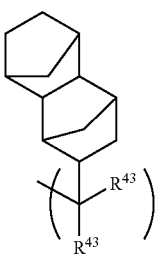

(A-3)-17
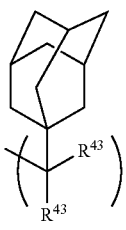

(A-3)-18
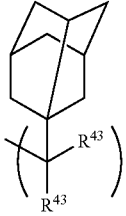

In the above formulae (A-3)-1 to (A-3)-18, $R^{43}$ is each independently a straight, branched or cyclic $C_1$-$C_8$ alkyl group or a $C_6$-$C_{20}$ aryl group, typically phenyl; each of $R^{44}$ and $R^{46}$ is hydrogen or a straight, branched or cyclic $C_1$-$C_{20}$ alkyl group; and $R^{45}$ is a $C_6$-$C_{20}$ aryl group, typically phenyl.

In a further embodiment, the fullerene may be crosslinked within the molecule or between molecules with groups containing a di- or polyvalent alkylene or arylene group ($R^{47}$), as represented by the general formula (A-3)-19 or (A-3)-20.

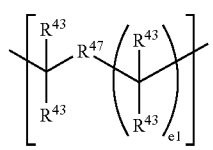
(A-3)-19

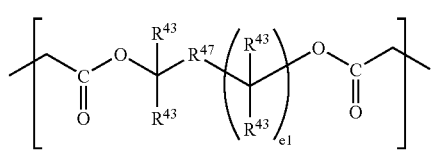
(A-3)-20

In formulae (A-3)-19 and (A-3)-20, $R^{43}$ is as defined above; $R^{47}$ is a straight, branched or cyclic $C_1$-$C_{20}$ alkylene group or an arylene group such as phenylene, which may contain a hetero atom or atoms such as oxygen, sulfur or nitrogen atom; e1 is an integer of 1 to 3.

In formulae (A-1), (A-2) and (A-3), $R^{30}$, $R^{33}$ and $R^{36}$ are independently selected from substituted or unsubstituted aryl groups, typically phenyl, p-methylphenyl, p-ethylphenyl and alkoxy-substituted phenyl groups such as p-methoxyphenyl, aralkyl groups such as benzyl and phenethyl, and alkyl and oxoalkyl groups which contain one or more oxygen atom or in which a hydrogen atom attached to a carbon atom is substituted by a hydroxyl group or two hydrogen atoms are substituted by an oxygen atom to form a carbonyl group, as shown below.

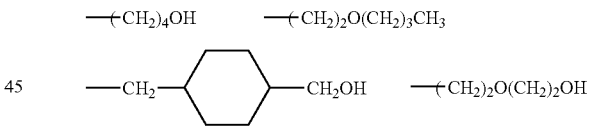

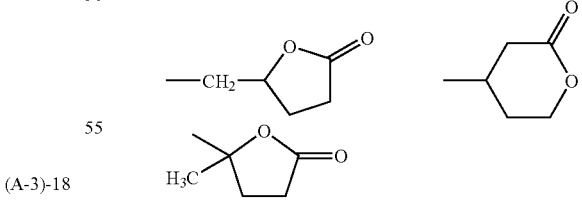

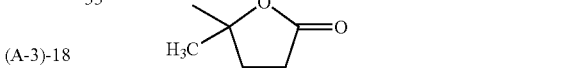

Examples of the trialkylsilyl group whose alkyl moiety each has 1 to 6 carbon atoms used as the acid labile group include trimethylsilyl, triethylsilyl and tert-butyldimethylsilyl.

Such acid labile groups may be introduced into fullerene by any desired method, for example, by reaction of fullerene with a phenol Grignard reagent having acid labile groups substituted thereon, or by previously synthesizing a fullerene with pendant phenol groups and introducing acid labile groups into phenolic hydroxyl group moieties.

In one embodiment, a modified fullerene having phenolic hydroxyl groups is reacted with an alkenyl ether compound in the presence of an acid catalyst, producing a polymer having some phenolic hydroxyl groups protected with alkoxyalkyl groups. The reaction.medium used herein is preferably selected from aprotic polar solvents such as dimethylformamide, dimethylacetamide, tetrahydrofuran and ethyl acetate. Such solvents may be used alone or in admixture of any. Examples of suitable acid catalysts include hydrochloric acid, sulfuric acid, trifluoromethanesulfonic acid, p-toluenesulfonic acid, methanesulfonic acid, and pyridinium p-toluenesulfonate. The amount of the reactant used is preferably 0.1 to 10 mol % per mol of phenolic hydroxyl groups on the polymer. The reaction temperature is usually −20° C. to 100° C., preferably 0° C. to 60° C., and the reaction time is usually about 0.2 to 100 hours, preferably about 0.5 to 20 hours.

In another embodiment, a halogenated alkyl ether compound is used. It is reacted with the polymer in the presence of a base to produce a polymer having some phenolic hydroxyl groups protected with alkoxyalkyl groups.

In this embodiment, the reaction solvent used is preferably selected from aprotic polar solvents such as acetonitrile, acetone, dimethylformamide, dimethylacetamide, tetrahydrofuran, and dimethyl sulfoxide. Such solvents may be used alone or in admixture of any. Preferred bases include triethylamine, pyridine, diisopropylamine and potassium carbonate. The amount of the reactant used is preferably at least 10 mol % per mol of phenolic hydroxyl groups on the polymer. The reaction temperature is often in the range of about −50° C. to 100° C., and preferably about 0° C. to 60° C. The reaction time is from about 0.5 to 100 hours, and preferably about 1 to 20 hours.

In a further embodiment, the acid labile group can be introduced by reacting a dialkyl dicarbonate compound or alkoxycarbonylalkyl halide with the high molecular weight compound in a solvent in the presence of a base. The reaction solvent used is preferably selected from aprotic polar solvents such as acetonitrile, acetone, dimethylformamide, dimethylacetamide, tetrahydrofuran, and dimethyl sulfoxide. Such solvents may be used alone or in admixture of any. Preferred bases include triethylamine, pyridine, imidazole, diisopropylamine and potassium carbonate. The amount of the reactant used is preferably at least 10 mol % per mol of phenolic hydroxyl groups on the starting polymer. The reaction temperature is often in the range of about 0° C. to 100° C., and preferably about 0° C. to 60° C. The reaction time is from about 0.2 to 100 hours, and preferably about 1 to 10 hours.

Exemplary of the dialkyl dicarbonate compound are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide and tert-butoxycarbonylethyl chloride.

It is noted that the synthesis is not limited to the aforementioned processes.

Resist Composition

Of the modified fullerene compounds of the invention, the modified fullerene compounds having acid labile groups substituted thereon are suitable as the base resin in positive resist compositions, and the modified fullerene compounds having unsubstituted phenol groups are suitable as the base resin in negative resist compositions. Positive resist compositions may be formulated by using the former fullerene compound as the base resin and blending it with an organic solvent, photoacid generator, dissolution inhibitor, basic compound, surfactant and the like, in an appropriate combination. Negative resist compositions may be formulated by using the latter fullerene compound as the base resin and adding thereto an organic solvent, photoacid generator, dissolution inhibitor, basic compound, surfactant, crosslinker and the like.

In an embodiment wherein a dissolution inhibitor is compounded in the positive resist composition, the difference in dissolution rate between exposed and unexposed areas can be further increased, leading to a further improved resolution.

As used in the resist compositions of the invention, the fullerene compound may be blended with any conventional polymer. The conventional polymers as used in conjunction with the positive type include polyhydroxystyrene partially protected with acid labile groups, (meth)acrylate-hydroxystyrene copolymers and cresol novolac resins protected with acid labile groups, and those copolymers having further copolymerized styrene, vinylnaphthalene, vinylanthracene, indene, acenaphthylene, norbornadiene, maleic anhydride, maleimides, vinyl ethers or the like, which polymers are insoluble or substantially insoluble in liquid alkaline developer, but become soluble in alkaline developer as a result of acid labile groups being eliminated under the action of acid. The acid labile groups on the conventional polymers are selected from the aforementioned groups, and may be the same or different from the acid labile groups on the fullerene.

The conventional polymers as used in conjunction with the negative type are alkali-soluble polymers such as polyhydroxystyrene and cresol novolac resins. For adjustment of an alkali dissolution rate, hydroxyl groups may be substituted by alkoxy or acetoxy groups, or an additional monomer such as styrene, vinylnaphthalene, vinylanthracene, indene, acenaphthylene, norbornadiene, maleic anhydride, maleimides, vinyl ethers or the like may be copolymerized.

In a further embodiment, the fullerene compound may be blended with a calixarene. The calixarene for the positive type has hydroxyl groups substituted by acid labile groups, while the calixarene for the negative type need not be substituted with acid labile groups. In the calixarene, the number of recurring units of benzene ring to form the cyclic structure is preferably 4 to 10. It is also possible to blend a thiacalixarene in which benzene rings are linked through —S— or —S(=O)$_2$—.

In the resist composition, additives like basic compound and surfactant may be added. The basic compound is effective for suppressing the rate of acid diffusion within the resist film, resulting in better resolution. The surfactant is effective for improving or controlling the coating property of the resist composition.

In the negative resist composition, a crosslinker capable of causing phenolic hydroxyl groups to crosslink under the action of acid may be added for reducing the alkali solubility of exposed areas.

As described above, the resist composition of the invention, whether it is positive or negative, may comprise an organic solvent, a photoacid generator, and optionally, a dissolution inhibitor, a basic compound, a surfactant and the like.

Solvent

Any organic solvent may be used in the resist composition of the invention, especially the chemically amplified resist composition, as long as the base resin, photoacid generator, and other additives are soluble therein. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, ethylene glycol monomethyl ether, ethylene glycol monoethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyllactone.

These solvents may be used alone or in combinations of two or more thereof. Of the above organic solvents, preferred are diethylene glycol dimethyl ether, 1-ethoxy-2-propanol, propylene glycol monomethyl ether acetate (PGMEA), and mixtures thereof in which the photoacid generator is most soluble.

The solvent is preferably used in an amount of about 200 to 1,000 parts by weight, more preferably about 400 to 800 parts by weight per 100 parts by weight of the base resin.

Photoacid Generator

The photoacid generator is a compound capable of generating an acid upon exposure to high energy radiation. The photoacid generators used herein include
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1b):

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be substituted by alkoxy or other groups. Also, $R^{101b}$ and $R^{101c}$, taken together, may form a ring. $R^{101b}$ and $R^{101c}$ are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl.

Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

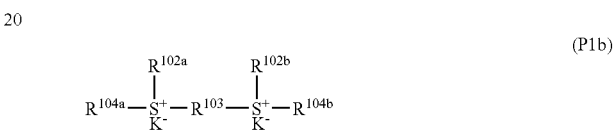

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. The non-nucleophilic counter ion represented by $K^-$ is as exemplified above.

(ii) Diazomethane Derivatives of Formula (P2)

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

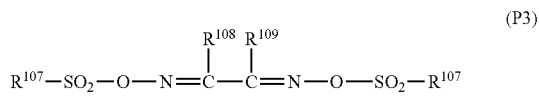

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

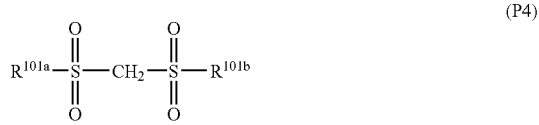

Herein, $R^{101a}$ and $R^{101b}$ are independently straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be substituted by alkoxy or other groups. Examples of $R^{101a}$ and $R^{101b}$ are as described above.

(v) Sulfonic Acid Esters of N-hydroxyimide Compounds of Formula (P5)

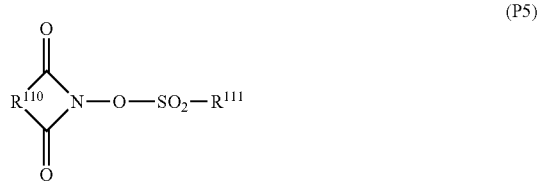

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be substituted by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be substituted by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generators (i) to (ix) include:

onium salts such as
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate, (2-norbornyl)methyl(2-oxocyclohexyl)sulfonium trifluoromethanesulfonate,
ethylenebis[methyl(2-oxocyclopentyl)sulfonium trifluoromethanesulfonate], and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;
β-ketosulfone derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone derivatives and dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate, N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 50 parts by weight, and especially 0.5 to 40 parts by weight, per 100 parts by weight of the base resin. Less than 0.1 pbw of the acid generator may generate an insufficient amount of acid upon light exposure, resulting in a low sensitivity and resolution. More than 50 pbw of the acid generator may lower the transmittance of the resist and result in a poor resolution.

Dissolution Inhibitor

A dissolution inhibitor may be compounded in the positive resist composition, especially chemically amplified positive resist composition of the invention. It is preferably a compound having on the molecule at least two phenolic hydroxyl groups, in which an average of from 0 to 100 mol % of all the hydrogen atoms on the phenolic hydroxyl groups are substituted by acid labile groups, or a compound having on the molecule carboxyl groups, in which an average of from 50 to 100 mol % of all the hydrogen atoms on the carboxyl groups are substituted by acid labile groups, both the compounds having a weight average molecular weight of 100 to 1,000, preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

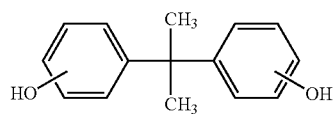
(D1)

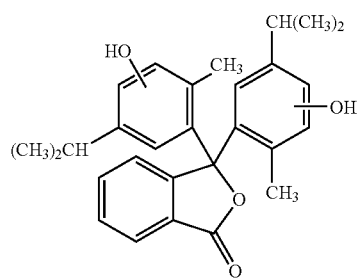
(D2)

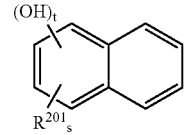
(D3)

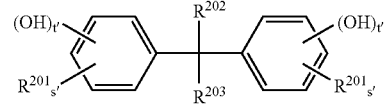
(D4)

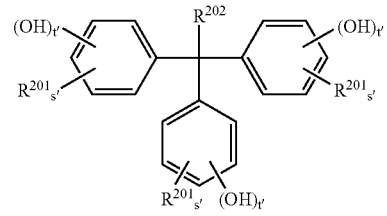
(D5)

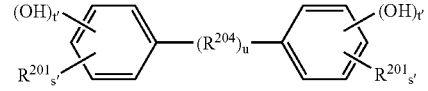
(D6)

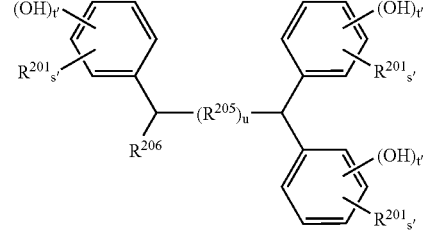
(D7)

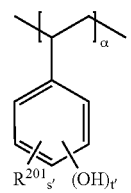
(D8)

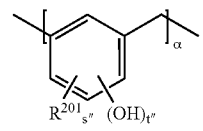
(D9)

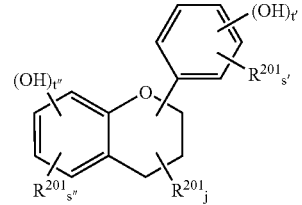
(D10)

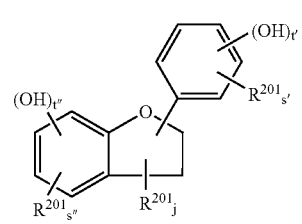
(D11)

-continued

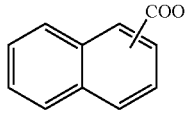
(D12)

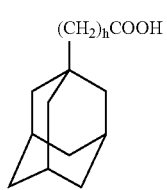
(D13)

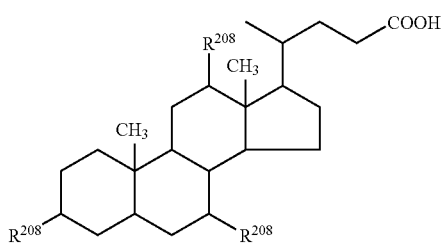
(D14)

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or $-(R^{207})_h-COOH$; $R^{204}$ is $-(CH_2)_i-$ (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1: s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a molecular weight of from 100 to 1,000.

The dissolution inhibitor may be compounded in an amount of 0 to 50 parts, preferably 5 to 50 parts, and more preferably 10 to 30 parts by weight, per 100 parts by weight of the base resin, and may be used singly or as a mixture of two or more thereof. Less than 5 parts of the dissolution inhibitor may fail to yield an improved resolution, whereas the use of more than 50 parts would lead to slimming of the patterned film, and thus a decline in resolution.

Basic Compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-4-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

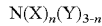

(B)-1

In the formula, n is 1, 2 or 3. The side chain X may be the same or different and is represented by the formula (X)-1, (X)-2 or, (X)-3 below. The side chain Y may be the same or different and stands for hydrogen or a straight, branched or cyclic alkyl group of 1 to 20 carbon atoms which may contain an ether or hydroxyl group. Two or three X's may bond together to form a ring.

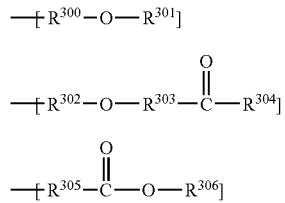

Herein, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain at least one hydroxyl group, ether group, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether group, ester group or lactone ring.

Illustrative, non-limiting examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbbnyl)methoxycarbonyl]-ethylamine, N,N-bis(2-hydrbxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of basic compounds of cyclic structure having the following general formula (B)-2.

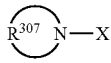 (B)-2

Herein X is as defined above, and $R^{307}$ is a straight or branched $C_2$-$C_{20}$ alkylene group which may contain one or more carbonyl, ether, ester or sulfide groups.

Illustrative examples of the compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-containing basic compounds having the following general formulae (B)-3 to (B)-6 may be blended.

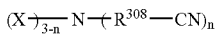 (B)-3

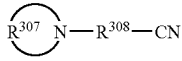 (B)-4

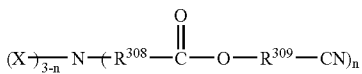 (B)-5

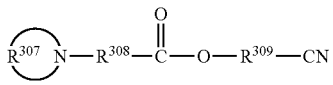 (B)-6

Herein, X, $R^{307}$ and n are as defined above, and $R^{308}$ and $R^{309}$ each are independently a straight or branched $C_1$-$C_4$ alkylene group.

Illustrative examples of the basic compounds having cyano group as represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably compounded in an amount of 0.001 to 2 parts, and especially 0.01 to 1 part by weight, per 100 parts by weight of the base resin. Less than 0.001 part of the basic compound may achieve no or little addition effect whereas more than 2 parts may result in too low a sensitivity.

If necessary, another base polymer may be compounded in the resist composition of the invention in addition to the base resin in the form of fullerene. The other base polymer is preferably selected from polymers bearing carboxyl or hydroxyl groups which may be substituted with acid labile groups and having a weight average molecular weight of 2,000 to 100,000. Illustrative examples include polyhydroxystyrene, (meth)acrylic acid polymers, and cresol novolac resins, and such polymers having further copolymerized styrene, indene, hydroxyindene, acenaphthylene, vinylnaphthalene, vinylanthracene, nortricyclene, vinyl ethers, maleic anhydride, maleimides or the like.

Other components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been substituted by —$R^{401}$—COOH (wherein $R^{401}$ is a straight or branched $C_1$-$C_{10}$ alkylene), and in which the molar ratio C/(C+D) of phenolic hydroxyl groups (C) to ≡C—COOH groups (D) in the molecule is from 0.1 to 1.0.

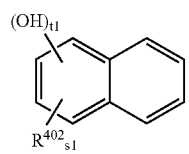
(A1)

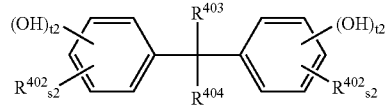
(A2)

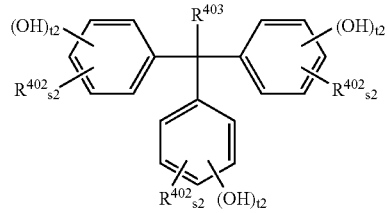
(A3)

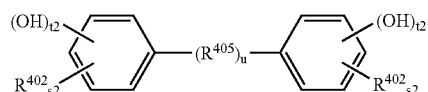
(A4)

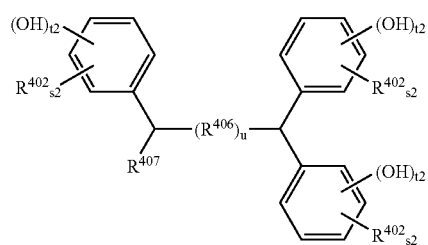
(A5)

-continued

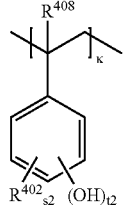
(A6)

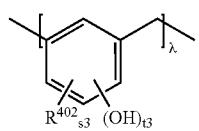
(A7)

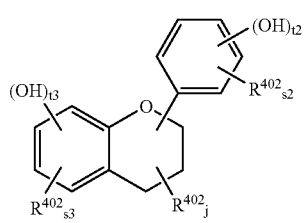
(A8)

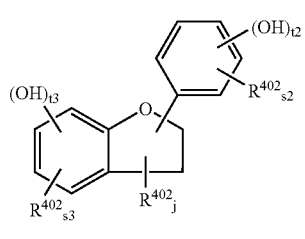
(A9)

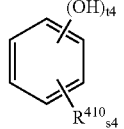
(A10)

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —$(R^{409})_h$—COOR' group (R' being hydrogen or —$R^{409}$—COOH); $R^{405}$ is —$(CH_2)_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkyl or alkenyl of 1 to 10 carbon atoms or a —$R^{411}$—COOH group; $R^{410}$ is hydrogen, a straight or branched alkyl or alkenyl of 1 to 8 carbon atoms, or a —$R^{411}$—COOH group; $R^{411}$ is a straight or branched alkylene of 1 to 10 carbon atoms; the letter j is an integer from 0 to 3; u is 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is such a number that the compound of formula (A6) may have a weight average molecular weight of 1,000 to 5,000; and λ is such a number that the compound of formula (A7) may have a weight average molecular weight of 1,000 to 10,000.

Group II:

Compounds of general formulas (A11) to (A15) below.

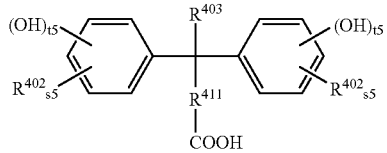
(A11)

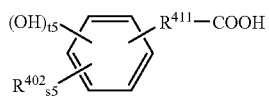
(A12)

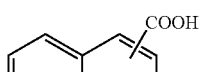
(A13)

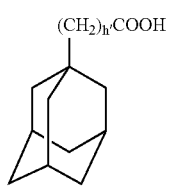
(A14)

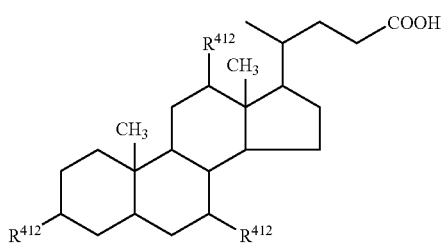
(A15)

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a =C—COOH group include compounds of the general formulas AI-1 to AI-14 and AII-1 to AII-10 below.

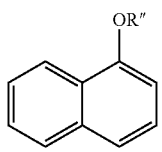
(AI-1)

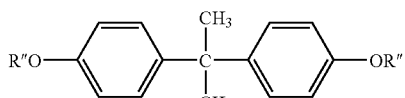
(AI-2)

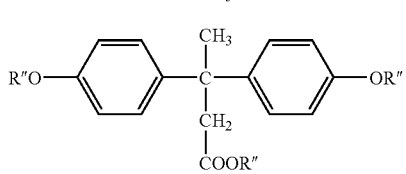
(AI-3)

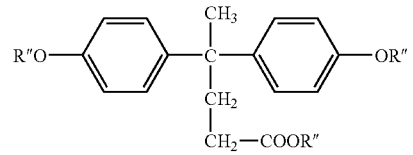
(AI-4)

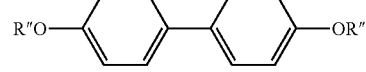
(AI-5)

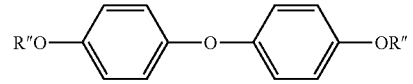
(AI-6)

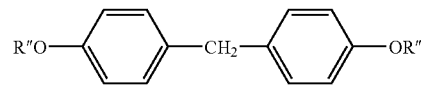
(AI-7)

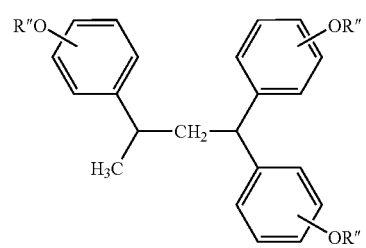
(AI-8)

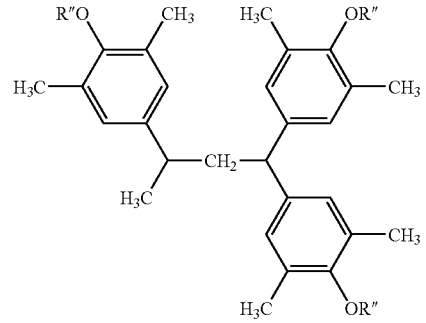
(AI-9)

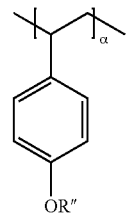
(AI-10)

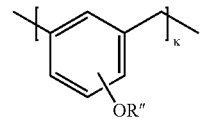
(AI-11)

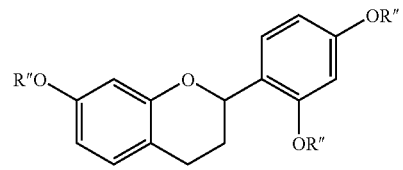
(AI-12)

-continued

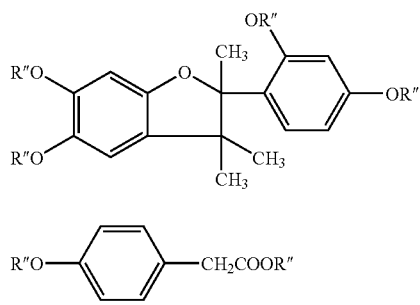
(AI-13)

(AI-14)

In the above formulas, R" is hydrogen or a CH₂COOH group such that the CH₂COOH group accounts for 10 to 100 mol % of R" in each compound, α and κ are as defined above.

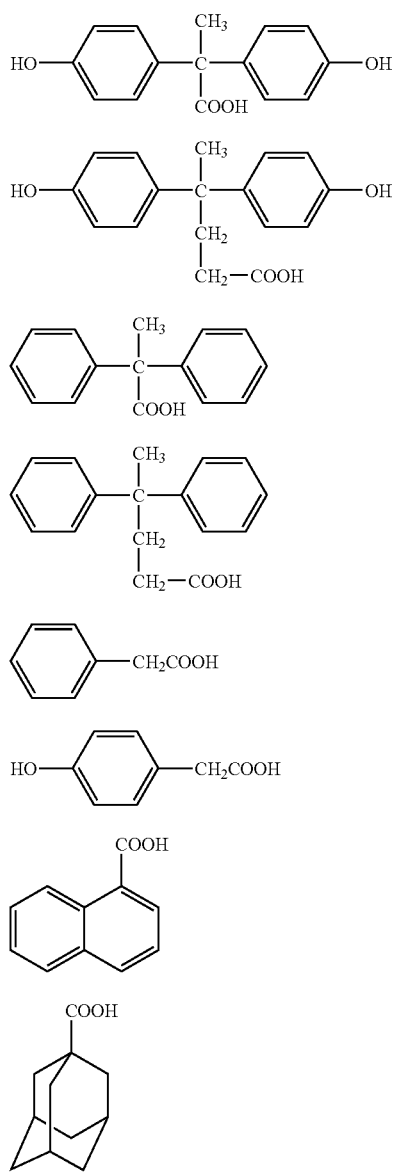

(AII-1)
(AII-2)
(AII-3)
(AII-4)
(AII-5)
(AII-6)
(AII-7)
(AII-8)

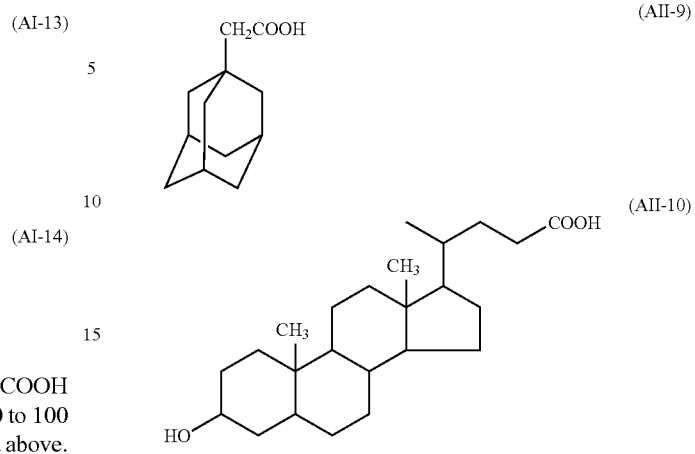

(AII-9)
(AII-10)

The compound bearing a =C—COOH group within the molecule may be used singly or as combinations of two or more thereof.

The compound bearing a =C—COOH group within the molecule is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

Crosslinker

In the negative resist composition, especially chemically amplified negative resist composition of the invention, a crosslinker is employed. Examples of the crosslinker include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Examples of other useful crosslinkers include alcoholic group-containing compounds such as naphthol novolac, m- and p-cresol novolac, naphthol-dicyclopentadiene novolac, m- and p-cresol-dicyclopentadiene novolac, 4,8-bis(hydroxymethyl)tricyclo[$5.2.1.0^{2,6}$]-decane, pentaerythritol, 1,2,6-hexanetriol, 4,4',4''-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxyl; and low-nuclear phenol compounds such as bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4''-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4''-ethylidyne tris[2-methylphenol], 4,4',4''-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4¹,4'',4'''-(1,2-ethanediylidene)tetrakisphenol, 4,4',4'',4'''-(ethanediylidene)tetrakis[2-methylphenol], 2,2'-methylenebis[6-[(2-hydroxy-5-methylphenyl)methyl]-4-methylphenol], 4,4',4''1,4'''-(1,4-phenylenedimethylidyne) tetrakisphenol, 2,4,6-tris(4-hydroxyphenylmethyl)-1,3-benzenediol, 2,4',4''-methylidenetrisphenol, 4,4',4''-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol, 2,2'-methylenebis[6-[(3,5-dimethyl-4-hydroxyphenyl)methyl]-4-methylphenol, 4,4',4'',4'''-tetrakis[(1-methylethylidene)bis(1,4-cyclohexyl-idene)]phenol, 6,6'-methylenebis[4-(4-hydroxyphenylmethyl)-1,2,3-benzenetriol, and 3,3',5,5'-tetrakis[(5-methyl-2-hydroxyphenyl) methyl]-[(1,1'-biphenyl)-4,4'-diol], and modified forms of the foregoing compounds in which a hydroxyl group is modified with epichlorohydrin into glycidyl ether.

The crosslinker is preferably compounded in an amount of up to 40 parts by weight, more preferably up to 30 parts, even more preferably up to 25 parts by weight per 100 parts by weight of the base resin. In resist compositions in which the crosslinker must be present as in the case of negative resist compositions, the lower limit amount of crosslinker is more than 0 part, preferably at least 2 parts, more preferably at least 4 parts by weight per 100 parts by weight of the base resin. In resist compositions in which the crosslinker may not always be present as in the case of positive resist compositions, the lower limit amount of crosslinker is equal to or more than 0 part. If used, an effective amount of crosslinker is preferred, and the desired range is 0.1 to 5 parts by weight per 100 parts by weight of the base resin.

Surfactant

In the resist composition of the invention, a surfactant may be added for improving coating characteristics or the like. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dainippon Ink & Chemicals, Inc.), Fluorad FC430, FC431 and FC-4430 (Sumitomo 3M Co., Ltd.), Aashiguard AG710, Surflon S-381, S-382, SC101, SC1O2, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, Fluorad FC430 and FC-4430, Surflon S-381, Surfynol E1004, KH-20 and KH-30 are preferred. These surfactants may be used alone or in admixture.

In the resist composition, especially chemically amplified resist composition of the invention, the surfactant is preferably formulated in an amount of up to 2 parts, and especially up to 1 part by weight, per 100 parts by weight of the base resin.

Where the resist composition of the invention is used in the microfabrication of various integrated circuits, any well-known lithography may be applicable although the invention is not limited thereto.

For instance, the positive resist composition is applied onto a substrate for integrated circuit manufature (e.g., Si, $SiO_2$, SiN, SiON, TiN, WSi, BPSG, SOG, organic anti-reflecting film, etc.) or a substrate for mask circuit manufacture (e.g., Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for about 10 seconds to 30 minutes, preferably 80 to 120° C. for about 30 seconds to 20 minutes. The resulting resist film is generally 0.1 to 2.0 μm thick. The resist film is then exposed to a predetermined pattern of high-energy radiation such as UV, deep-UV, electron beam, x-rays, excimer laser light, γ-rays and synchrotron radiation, directly or through a photomask. The exposure dose is preferably in the range of about 1 to 200 mJ/cm$^2$, more preferably about 10 to 100 mJ/cm$^2$, or preferably in the range of about 0.1 to 100 μC, more preferably about 0.5 to 50 μC. The film is further baked on a hot plate at 60 to 150° C. for about 10 seconds to 30 minutes, preferably 80 to 120° C. for about 30 seconds to 20 minutes (post-exposure baking=PEB).

Thereafter the resist film is developed with a developer in the form of an aqueous alkaline solution, for example, 0.1 to 5 wt %, preferably 2 to 3 wt % aqueous solution of tetramethylammonium hydroxide (TMAH) for about 10 seconds to 3 minutes, preferably about 20 seconds to 2 minutes by conventional techniques such as dip, puddle and spray techniques. In this way, a desired positive resist pattern is formed on the substrate because the areas exposed to radiation are dissolved away in the developer and the areas not exposed are not dissolved away. It is appreciated that the resist composition of the invention is best suited for micro-patterning using such high-energy radiation as electron beam, soft x-rays, x-rays, γ-rays and synchrotron radiation.

EXAMPLE

Synthesis Examples, Examples and Comparative Examples are given below for further illustrating the invention although the invention is not limited thereto.

Synthesis Example 1

The phenol-substituted fullerene used is nanom spectra 606Me-PhOH (Frontier Carbon Corp.) having the formula (2). This is designated Fullerene 0.

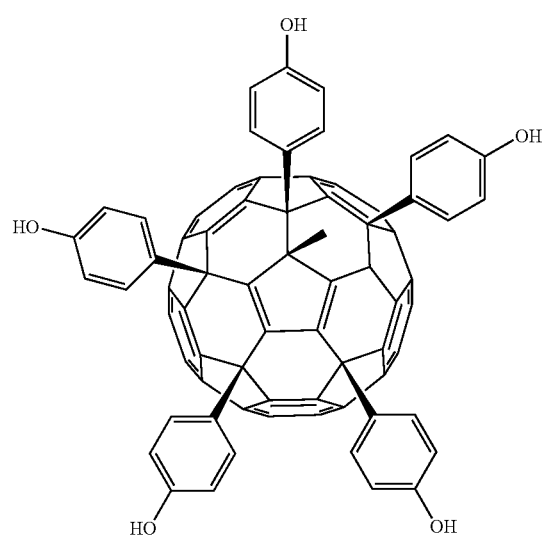

(2)

Nanom spectra 606Me-PhOH, 2 g, was dissolved in 10 ml of tetrahydrofuran, to which 0.1 g of methanesulfonic acid and 0.5 g of ethyl vinyl ether were added. Reaction was allowed to occur for one hour at room temperature and quenched by adding 0.25 g of 30% aqueous ammonia. The reaction solution was combined with 20 ml of aqueous acetic acid for crystal precipitation, followed by two times of water washing. The resulting solids were collected by filtration and dried in vacuo at 40° C., obtaining 2.2 g of solids, designated Fullerene 1.

The polymer thus obtained was characterized by $^{13}$C-NMR and $^1$H-NMR, finding that three of the five hydroxy groups had been substituted by ethoxyethoxy groups.

Synthesis Example 2

Nanom spectra 606Me-PhOH, 2 g, was dissolved in 10 ml of pyridine. With stirring, 1.6 g of di-tert-butyl dicarbonate was added to the solution at 45° C. Reaction was allowed to occur for one hour. The reaction solution was added dropwise to 20 ml of water, yielding solids. The solids were collected by filtration, dissolved in 10 ml of acetone, and added dropwise to 200 ml of water. Subsequent filtration and vacuum drying yielded 2.4 g of solids, designated Fullerene 2.

The polymer thus obtained was characterized by $^{13}$C-NMR and $^1$H-NMR, finding that three of the five hydroxy groups had been substituted by t-butoxycarbonyl groups.

Synthesis Example 3

Nanom spectra 606Me-PhOH, 2 g, was dissolved in 10 ml of pyridine. With stirring, 1.8 g of t-butyl 2-bromoacetate was added to the solution at 45° C. Reaction was allowed to occur for one hour. The reaction solution was added dropwise to 20 ml of water, yielding solids. The solids were collected by filtration, dissolved in 10 ml of acetone, and added dropwise to 200 ml of water. Subsequent filtration and vacuum drying yielded 2.5 g of solids, designated Fullerene 3.

The polymer thus obtained was characterized by $^{13}$C-NMR and $^1$H-NMR, finding that three of the five hydroxy groups had been substituted by t-butyl 2-bromoacetate.

Synthesis Example 4

Nanom spectra 606Me-PhOH, 2 g, was dissolved in 100 ml of tetrahydrofuran, to which 0.1 g of methanesulfonic acid and 0.5 g of 1,4-butanediol divinyl ether were added. Reaction was allowed to occur for one hour at room temperature and quenched by adding 0.25 g of 30% aqueous ammonia. The reaction solution was combined with 20 ml of aqueous acetic acid for crystal precipitation, followed by two times of water washing. The resulting solids were collected by filtration and dried in vacuo at 40° C., obtaining 2.2 g of solids, designated Fullerene 4.

The polymer thus obtained was characterized by $^{13}$C-NMR and $^1$H-NMR, finding that one of the five hydroxy groups had been substituted by 1,4-butanediol divinyl ether between molecules, as shown below.

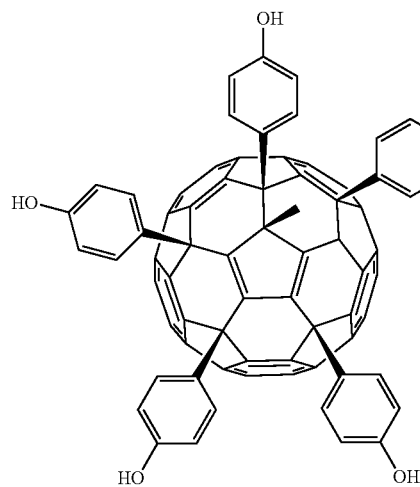
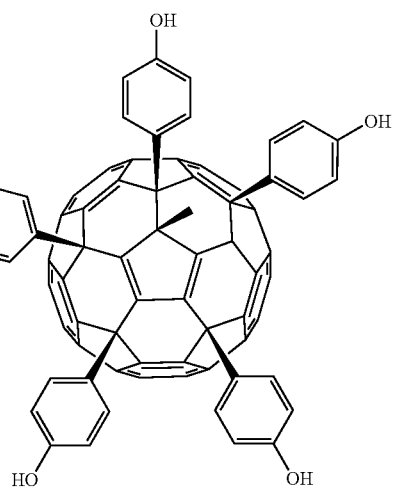

Synthesis Example 5

Nanom spectra 606Me-PhOH, 2 g, was dissolved in 100 ml of tetrahydrofuran, to which 0.1 g of methanesulfonic acid and 0.5 g of 1,4-divinyl ether cyclohexane were added. Reaction was allowed to occur for one hour at room temperature and quenched by adding 0.25 g of 30% aqueous ammonia. The reaction solution was combined with 20 ml of aqueous acetic acid for crystal precipitation, followed by two times of water washing. The resulting solids were collected by filtration and dried in vacuo at 40° C., obtaining 2.2 g of solids, designated Fullerene 5.

The polymer thus obtained was characterized by $^{13}$C-NMR and $^1$H-NMR, finding that one of the five hydroxy groups had been substituted by 1,4-divinyl ether cyclohexane between molecules, as shown below.

Examples and Comparative Examples

Positive or negative resist compositions were prepared in accordance with the formulation shown in Table 1 by using the polymers synthesized above, dissolving the polymers and other components in solvents, and filtering through a filter having a pore size of 0.2 μm.

The base polymers used for comparison include a monodisperse hydroxystyrene polymer having a Mw of 10,000, a dispersity Mw/Mn of 1.1 and a percent substitution with t-amyloxy of 28 mol %, designated Base Polymer 1, and a monodisperse hydroxystyrene polymer having a Mw of 10,000, a dispersity Mw/Mn of 1.1 and a percent substitution with acetoxy of 10 mol %, designated Base Polymer 2.

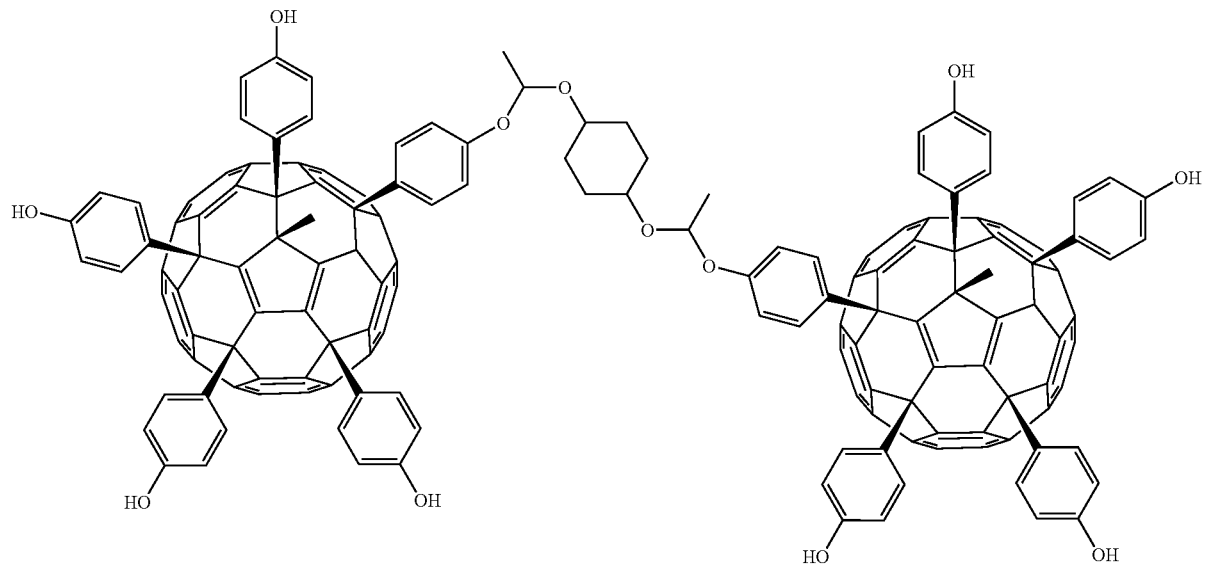

The components in Table 1 are identified below.

Polymer:
  Fullerenes 0 to 5
  Base Polymers 1, 2
Organic solvent:
  PGMEA (propylene glycol monomethyl ether acetate)
  EL (ethyl lactate)
Photoacid generator:
  PAG 1, 2 having the structural formulae shown below
Basic compound:
  TMMEA (trismethoxymethoxyethylamine) having the structural formula shown below
Dissolution inhibitor:
  DRI 1-4 having the structural formulae shown below
Crosslinker:
  TMGU having the structural formula shown below

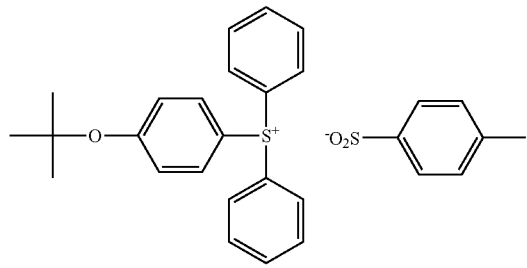
PAG1

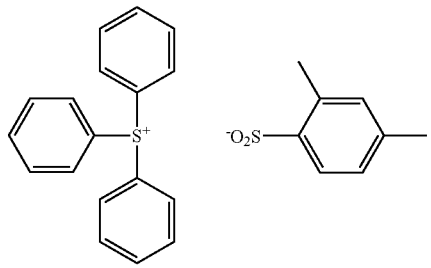
PAG2

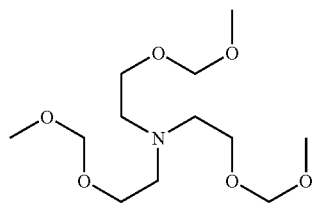
TMMEA

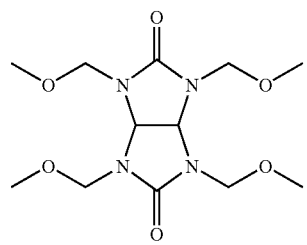
TMGU

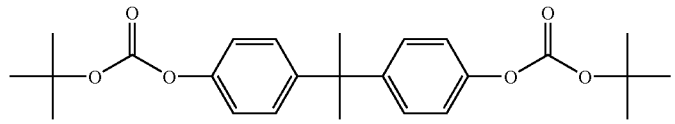
DRI 1

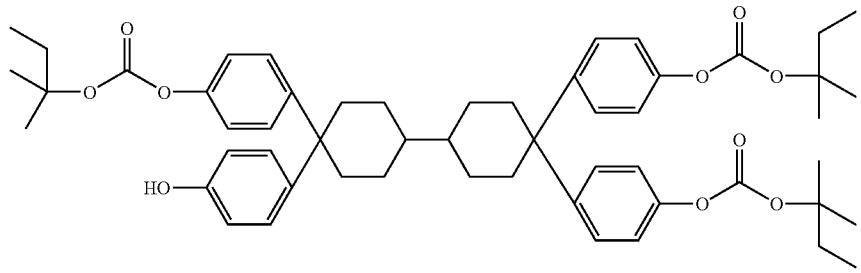
DRI 2

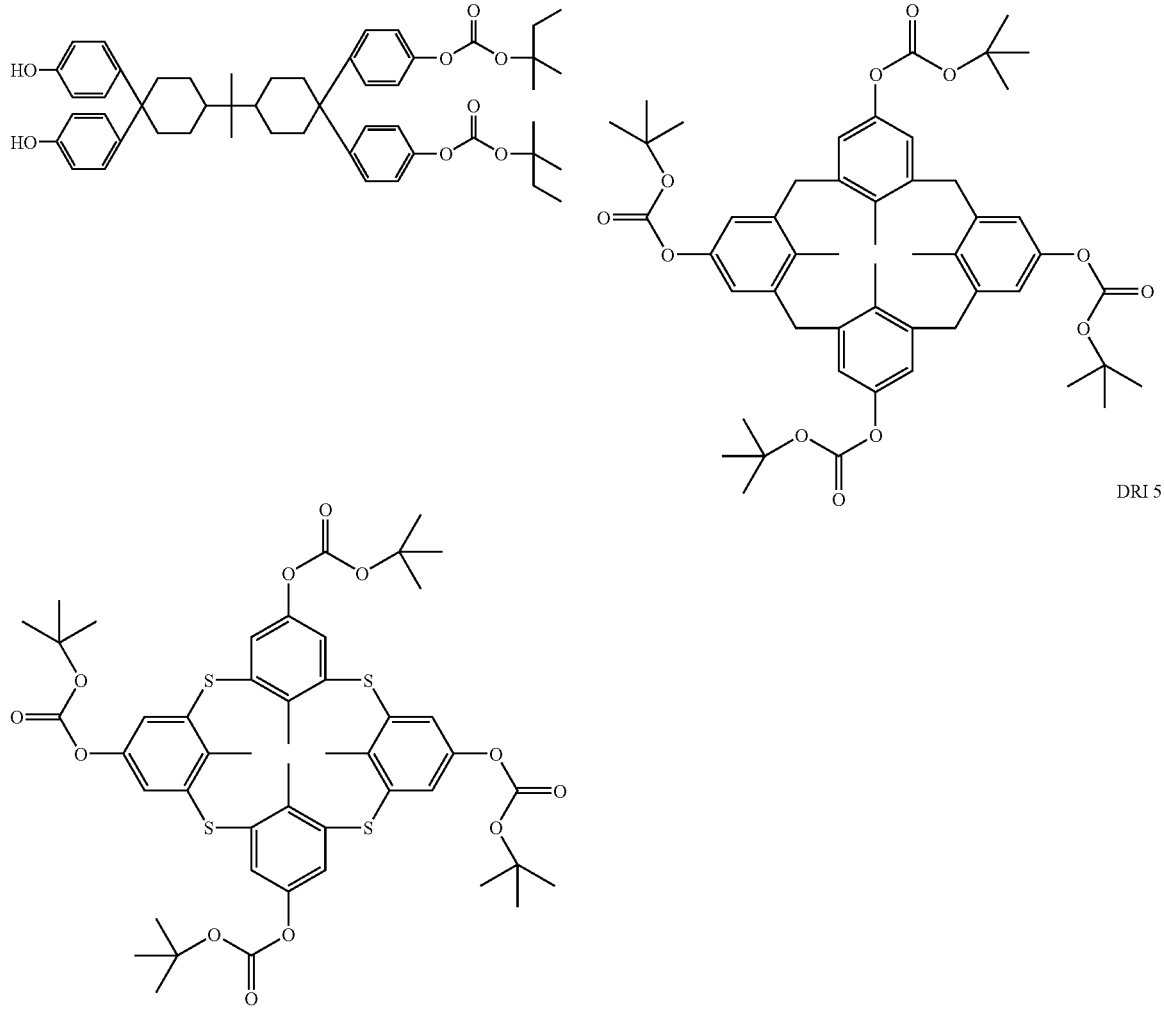

EB Writing Test

Positive or negative resist compositions were prepared in accordance with the formulation shown in Table 1 by using the polymers synthesized above, dissolving the polymers and other components in solvents, and filtering through a filter having a pore size of 0.2 μm.

Using Clean Track Mark 5 (Tokyo Electron Ltd.), the resist solutions were spin-coated onto 6-inch silicon substrates and pre-baked on a hot plate at 110° C. for 90 seconds to form a resist film of 100 nm thick. Using an e-beam direct writing system HL-800D by Hitachi Ltd., image writing was performed in a vacuum chamber at a HV voltage of 50 keV.

Immediately after the image writing, post-exposure baking (PEB) was effected on a hot plate at 110° C. for 90 seconds, using Clean Track Mark 5 (Tokyo Electron Ltd.). This was followed by puddle development in an aqueous solution of 2.38 wt % tetramethylammonium hydroxide (TMAH) for 30 seconds, giving positive or negative patterns.

The resulting resist patterns were evaluated. The sensitivity was the exposure dose (μC/cm$^2$) which provided a 1:1 resolution at the top and bottom of a 0.12-μm line-and-space pattern. Edge roughness (nm) was determined under a scanning electron microscope (SEM).

Table 1 reports the formulation of resist compositions and the results of sensitivity and edge roughness thereof upon EB writing.

TABLE 1

| Polymer (pbw) | Photoacid generator (pbw) | Base (pbw) | Dissolution inhibitor/ crosslinker (pbw) | Organic solvent (pbw) | Sensitivity (μC/cm$^2$) | Edge roughness (nm) |
|---|---|---|---|---|---|---|
| Fullerene 1 (100) | PAG1 (5) | TMMEA (0.25) | — | PGMEA(560) EL(240) | 5.8 | 6.8 |

TABLE 1-continued

| Polymer (pbw) | Photoacid generator (pbw) | Base (pbw) | Dissolution inhibitor/ crosslinker (pbw) | Organic solvent (pbw) | Sensitivity ($\mu C/cm^2$) | Edge roughness (nm) |
|---|---|---|---|---|---|---|
| Fullerene 2 (100) | PAG1 (5) | TMMEA (0.25) | — | PGMEA(560) EL(240) | 5.9 | 5.8 |
| Fullerene 3 (100) | PAG1 (5) | TMMEA (0.25) | — | PGMEA(560) EL(240) | 5.1 | 6.9 |
| Fullerene 4 (100) | PAG1 (5) | TMMEA (0.25) | — | PGMEA(560) EL(240) | 5.1 | 6.5 |
| Fullerene 5 (100) | PAG1 (5) | TMMEA (0.25) | — | PGMEA(560) EL(240) | 4.8 | 6.3 |
| Fullerene 3 (70) + Base Polymer 1 (30) | PAG1 (5) | TMMEA (0.25) | — | PGMEA(560) EL(240) | 5.1 | 7.1 |
| Fullerene 4 (50) | PAG1 (5) | TMMEA (0.25) | DRI 1 (50) | PGMEA(560) EL(240) | 4.8 | 6.3 |
| Fullerene 4 (50) | PAG1 (5) | TMMEA (0.25) | DRI 2 (50) | PGMEA(560) EL(240) | 4.3 | 6.8 |
| Fullerene 4 (50) | PAG1 (5) | TMMEA (0.25) | DRI 3 (50) | PGMEA(560) EL(240) | 4.2 | 5.6 |
| Fullerene 4 (50) | PAG1 (5) | TMMEA (0.25) | DRI 4 (50) | PGMEA(560) EL(240) | 4.6 | 5.7 |
| Fullerene 4 (50) | PAG1 (5) | TMMEA (0.25) | DRI 4 (50) | PGMEA(560) EL(240) | 4.9 | 5.8 |
| Fullerene 0 (100) | PAG2 (5) | TMMEA (0.25) | TMGU (10) | PGMEA(560) EL(240) | 6.9 | 7.2 |
| Fullerene 0 (70) + Base Polymer 2 (30) | PAG2 (5) | TMMEA (0.25) | TMGU (10) | PGMEA(560) EL(240) | 6.9 | 7.6 |
| Base Polymer 1 (100) | PAG1 (5) | TMMEA (0.25) | — | PGMEA(560) EL(240) | 9.8 | 8.9 |
| Base Polymer 2 (100) | PAG2 (5) | TMMEA (0.25) | TMGU (10) | PGMEA(560) EL(240) | 10.5 | 10.2 |

Dry Etching Test

Each polymer, 2 g, was dissolved in 10 g of PGMEA, and passed through a filter having a pore size of 0.2 μm. The polymer solution was spin coated onto a silicon substrate and baked, forming a polymer film of 200 nm thick. Dry etching tests were carried out on the polymer films by etching them under two sets of conditions. The results are shown in Table 2.

(1) Etching Test with $CHF_3/CF_4$ Gas

Using a dry etching instrument TE-8500P (Tokyo Electron Ltd.), the difference in polymer film thickness before and after etching was determined. The etching conditions are given below

| chamber pressure | 40.0 Pa |
|---|---|
| RF power | 1000 W |
| gap | 9 mm |
| $CHF_3$ gas flow rate | 30 ml/min |
| $CF_4$ gas flow rate | 30 ml/min |
| Ar gas flow rate | 100 ml/min |
| time | 60 sec |

(2) Etching Test with $Cl_2/BCl_3$ Gas

Using a dry etching instrument L-507D-L (Nichiden Anerba K.K.), the difference in polymer film thickness before and after etching was determined. The etching conditions are given below.

| chamber pressure | 40.0 Pa |
|---|---|
| RF power | 300 W |
| gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| time | 60 sec |

The smaller the difference in polymer film thickness before and after etching, i.e., the lower the etching rate, the polymer film is more resistant to etching. The results are shown in Table 2.

TABLE 2

| Polymer | $CHF_3/CF_4$ gas etching rate (nm/min) | $Cl_2/BCl_3$ gas etching rate (nm/min) |
|---|---|---|
| Fullerene 0 | 40 | 55 |
| Fullerene 1 | 65 | 75 |
| Fullerene 2 | 68 | 68 |
| Fullerene 3 | 72 | 76 |
| Fullerene 4 | 70 | 73 |
| Fullerene 5 | 68 | 70 |
| Base Polymer 1 | 113 | 111 |
| Base Polymer 2 | 96 | 95 |

It is evident from the test results of Tables 1 and 2 that the resist compositions using the polymer within the scope of the invention have a high sensitivity and resolution and exhibit dry etching resistance as demonstrated by a smaller difference in polymer film thickness before and after etching.

Japanese Patent Application No. 2005-042472 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition of a chemical amplified type comprising a fullerene having the general formula (1):

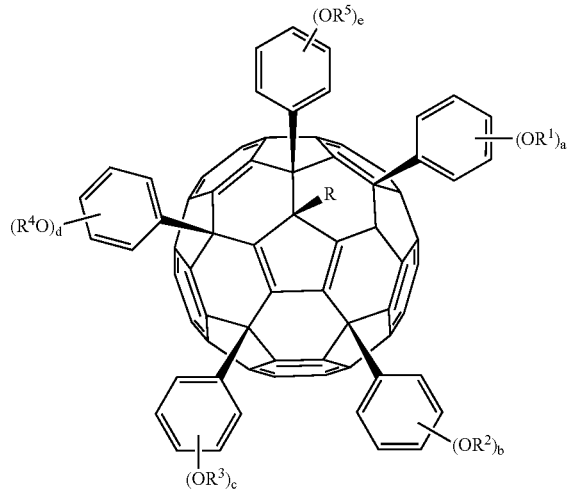

wherein R is hydrogen or an alkyl group of 1 to 4 carbon atoms, $R^1$ to $R^5$ each are hydrogen or an acid labile group, a, b, c, d, and e each are an integer of 0 to 2, and the sum of a+b+c+d+e is 1 to 10, an organic solvent, and a photoacid generator.

2. The resist composition of claim 1 which is of the chemically amplified positive type, further comprising a dissolution inhibitor.

3. The resist composition of claim 1 which is of the chemically amplified negative type, further comprising a crosslinking agent.

4. The resist composition of claim 1, further comprising a basic compound or a surfactant or both.

5. A process for forming a pattern, comprising the steps of:
applying the resist composition of claim 1 onto a substrate to form a coating,
heat treating the coating and exposing the coating to high energy radiation,
optionally heat treating the exposed coating, and developing the coating with a developer.

* * * * *